(12) United States Patent
Lee

(10) Patent No.: US 8,314,435 B2
(45) Date of Patent: Nov. 20, 2012

(54) ORGANIC LIGHT EMITTING DIODE DISPLAY

(75) Inventor: Sehee Lee, Kyungbuk (KR)

(73) Assignee: LG Display Co., Ltd., Seoul (KR)

( * ) Notice: Subject to any disclaimer, the term of this patent is extended or adjusted under 35 U.S.C. 154(b) by 80 days.

(21) Appl. No.: 12/779,498

(22) Filed: May 13, 2010

(65) Prior Publication Data

US 2011/0073884 A1    Mar. 31, 2011

(30) Foreign Application Priority Data

Sep. 29, 2009 (KR) .................. 10-2009-0092450

(51) Int. Cl.
*H01L 51/52* (2006.01)

(52) U.S. Cl. ............. 257/89; 257/E51.022; 257/40; 257/642; 257/643; 257/759; 257/E51.052; 257/E25.008; 257/E25.009

(58) Field of Classification Search ............. 257/89, 257/E51.022, 40, 642, 643, 759, E51.001, 257/E51.052, E25.008, E25.009
See application file for complete search history.

(56) References Cited

U.S. PATENT DOCUMENTS

| 2004/0036421 A1* | 2/2004 | Arnold et al. ............. 315/169.3 |
| 2007/0131948 A1* | 6/2007 | Seo et al. .................. 257/87 |
| 2007/0286944 A1* | 12/2007 | Yokoyama et al. ........ 427/66 |
| 2009/0242911 A1* | 10/2009 | Ishihara et al. ............ 257/89 |

* cited by examiner

*Primary Examiner* — Marc Armand
(74) *Attorney, Agent, or Firm* — Morgan, Lewis & Bockius LLP

(57) ABSTRACT

An organic light emitting diode display is disclosed. The organic light emitting diode display includes a plurality of subpixels that emit light of at least three colors, the plurality of subpixels each including a first electrode, an organic light emitting layer, and a second electrode. Each of the organic light emitting layers of at least two of the plurality of subpixels includes at least two electron transport layers. The organic light emitting layer of at least one of the plurality of subpixels includes at least one electron transport layer.

6 Claims, 6 Drawing Sheets

ORGANIC LIGHT EMITTING DIODE DISPLAY

This application claims the benefit of Korean Patent Application No. 10-2009-0092450 filed on Sep. 29, 2009, the entire contents of which is incorporated herein by reference for all purposes as if fully set forth herein.

BACKGROUND OF THE INVENTION

1. Field of the Invention

Embodiments of the invention relate to an organic light emitting diode display.

2. Discussion of the Related Art

An organic light emitting element used in an organic light emitting diode (OLED) display has a self-emission structure in which a light emitting layer is formed between two electrodes. The organic light emitting element injects electrons from a cathode corresponding to an electron injection electrode and holes from an anode corresponding to an hole injection electrode into the light emitting layer and emits light when an exciton formed by a combination of the injected electrons and the injected holes falls from an excitation level to a ground level.

The OLED display using the organic light emitting element may be classified into a top emission type OLED display, a bottom emission type OLED display, and a dual emission type OLED display depending on an emitting direction of light. The OLED display may be classified into a passive matrix type OLED display and an active matrix type OLED display depending on a driving manner.

In the OLED display, when a scan signal, a data signal, a power, etc. are supplied to a plurality of subpixels arranged in a matrix form, selected subpixels of the plurality of subpixels emit light to thereby display an image.

Each of the subpixels includes a transistor unit including a switching transistor, a driving transistor, and a capacitor and an organic light emitting diode including a first electrode connected to the driving transistor of the transistor unit, an organic light emitting layer, and a second electrode.

In the OLED display, each of the subpixels generally has a different luminance so as to obtain a white balance of a unit pixel including a red subpixel, a green subpixel, and a blue subpixel. However, in a related art OLED display, lifetimes of the red, green, and blue subpixels constituting the unit pixel are different from one another. Thus, as driving time of the related art OLED display increases, a luminance of the related art OLED display is reduced or the problem of a movement of a color coordinate occurs.

SUMMARY OF THE INVENTION

In one aspect, there is an organic light emitting diode display comprising a plurality of subpixels that emit light of at least three colors, the plurality of subpixels each including a first electrode, an organic light emitting layer, and a second electrode, wherein each of the organic light emitting layers of at least two of the plurality of subpixels includes at least two electron transport layers, wherein the organic light emitting layer of at least one of the plurality of subpixels includes at least one electron transport layer.

In another aspect, there is an organic light emitting diode display comprising a plurality of subpixels that emit light of at least three colors, the plurality of subpixels each including a first electrode, an organic light emitting layer, and a second electrode, wherein each of the organic light emitting layers of at least two of the plurality of subpixels includes an electron transport layer, the thicknesses of the electron transport layers of the organic light emitting layers of at least two subpixels being equal to each other, wherein the organic light emitting layer of at least one of the plurality of subpixels includes an electron transport layer whose a thickness is different from the thicknesses of the organic light emitting layers of at least two subpixels.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail embodiments of the invention examples of which are illustrated in the accompanying drawings.

First Exemplary Embodiment

Figure 1:
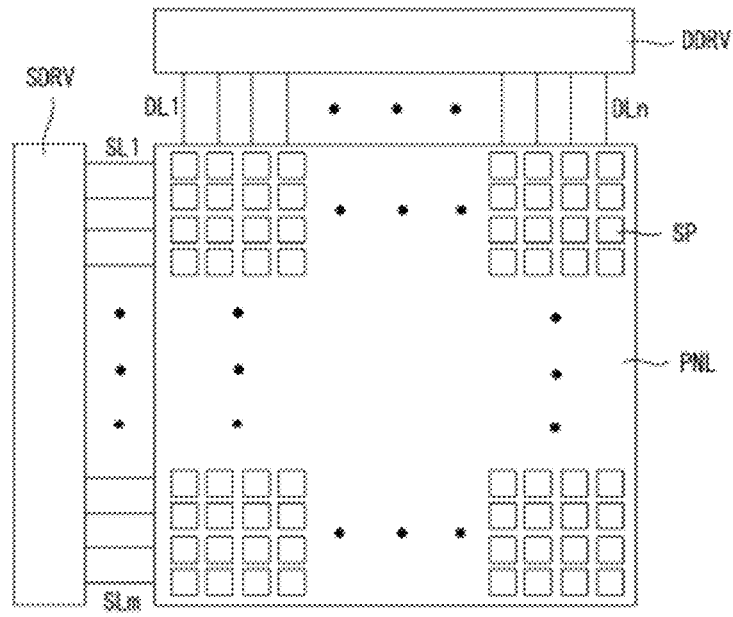
FIG. 1 is a schematic block diagram of an organic light emitting diode (OLED) display according to a first exemplary embodiment of the invention.
Figure 2:
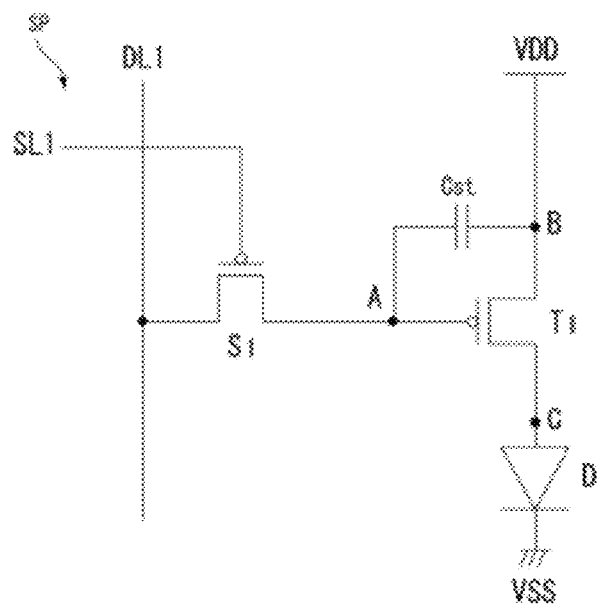
FIG. 2 illustrates a circuit configuration of a subpixel.

As shown in FIGS. 1 and 2, an organic light emitting diode (OLED) display according to a first exemplary embodiment of the invention includes a panel PNL including a plurality of subpixels SP arranged in a matrix form, a scan driver SDRV supplying a scan signal to scan lines SL1 to SLm of the subpixels SP, and a data driver DDRV supplying a data signal to data lines DL1 to DLn of the subpixels SP.

The subpixels SP may be arranged in a passive matrix form or an active matrix form. When the subpixels SP are arranged in the active matrix form, each of the subpixels SP may have a 2T1C (T: transistor and C: capacitor) structure including a switching transistor S1, a driving transistor T1, a capacitor Cst, and an organic light emitting diode D or a structure adding a transistor and a capacitor to the 2T1C structure.

In each of the subpixels SP having the 2T1C structure, as shown in FIG. 2, a gate electrode of the switching transistor S1 is connected to the scan line SL1 receiving the scan signal, one terminal of the switching transistor S1 is connected to the data line DL1 receiving the data signal, and the other terminal of the switching transistor S1 is connected to a first node A. A gate electrode of the driving transistor T1 is connected to the first node A, one terminal of the driving transistor T1 is connected to a second node B connected to a first power line VDD receiving a high potential power voltage, and the other terminal of the driving transistor T1 is connected to a third node C. One terminal of the capacitor Cst is connected to the first node A, and the other terminal of the capacitor Cst is connected to the second node B. An anode electrode of the organic light emitting diode D is connected to the third node C connected to the other terminal of the driving transistor T1, and a cathode electrode of the organic light emitting diode D is connected to a second power line VSS receiving a low potential power voltage.

Although the explanation was given of an example of the p-type transistors S1 and T1 of each subpixel SP in the first exemplary embodiment of the invention, the n-type transistors S1 and T1 may be used. When the n-type transistors S1 and T1 are used, a connection between other elements S1, T1, and Cst as well as a location of the organic light emitting diode D may vary. Thus, FIG. 2 illustrates to help an understanding of a circuit configuration of a general subpixel, but the embodiments of the invention are not limited thereto. Further, the high potential power voltage supplied through the first power line VDD may be greater than the low potential power voltage supplied through the second power line VSS. Levels of the voltages supplied through the first power line VDD and through the second power line VSS may be switched depending on a driving manner.

The above-described subpixel SP may operate as follows. When the scan signal is supplied through the scan line SL1, the switching transistor S1 is turned on. Then, when the data signal supplied through the data line DL1 is supplied to the first node A via the turned-on switching transistor. S1, the data signal is stored in the capacitor Cst as a data voltage. Then, when the scan signal is cut off and the switching transistor S1 is turned off, the driving transistor T1 is driven according to the data voltage stored in the capacitor Cst. Then, when the high potential power voltage supplied through the first power line VDD flows through the second power line VSS, the organic light emitting diode D emits light in a direction of the anode electrode or the cathode electrode of the organic light emitting diode D. The embodiments of the invention are not limited to a driving method of the subpixel SP illustrated in FIG. 2.

The structure of the above-described OLED display is described below.

Figure 3:
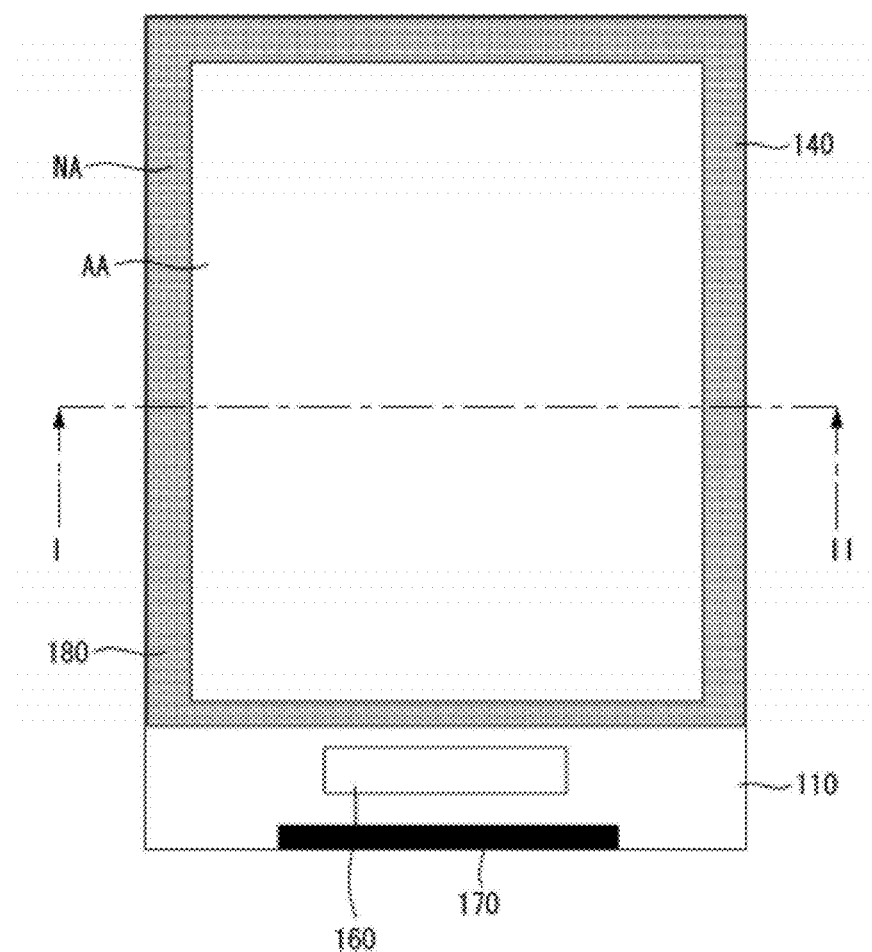
FIG. 3 is a plane view of an organic light emitting diode (OLED) display
Figure 4:
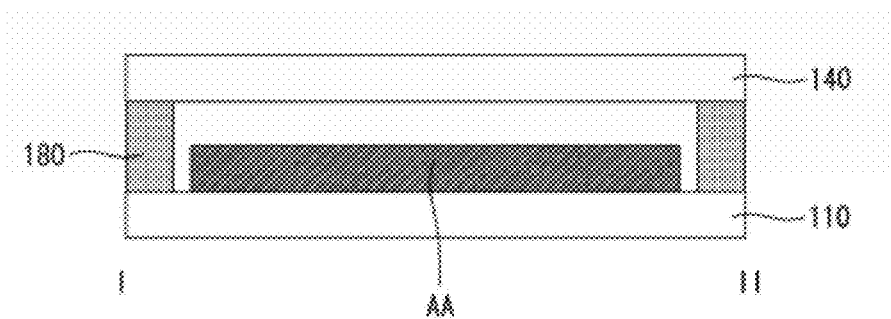
FIG. 4 is a cross-sectional view taken along line I-II of FIG. 3.

As shown in FIGS. 3 and 4, in the OLED display according to the first exemplary embodiment of the invention, the subpixels positioned in a display area AA are sealed so that the subpixels are protected from moisture or oxygen. For this, a substrate 110 is attached to a sealing substrate 140 using an adhesive member 180 formed in a non-display area NA positioned outside the display area AA, and thus the substrate 110 and the sealing substrate 140 are sealed together. Further, the substrate 110 may be sealed by a protective layer corresponding to the sealing substrate 140.

The OLED display includes a pad unit 170 outside the substrate 110 to receive various signals and various voltages from the outside. The OLED display drives a plurality of elements of the OLED display using a driving device 160 configured by one chip. The driving device 160 includes the data driver and the scan driver illustrated in FIG. 1, or other drivers. The data driver and the scan driver may be separately positioned on the substrate 110.

Figure 5:
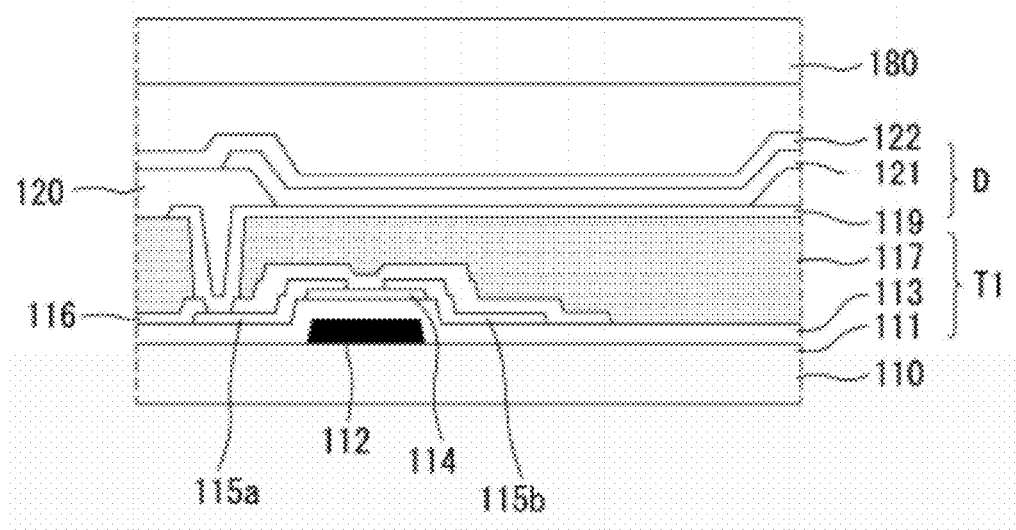
FIG. 5 is a cross-sectional view of a subpixel.

As shown in FIG. 5, each of the subpixels positioned in the display area AA may have the following structure.

A buffer layer 111 is positioned on the substrate 110. The buffer layer 111 may protect a thin film transistor to be formed in a succeeding process from impurities (e.g., alkali ions discharged from the substrate 110). The buffer layer 111 may be formed using silicon oxide (SiOx) silicon nitride ($SiN_x$), or using other materials.

A gate electrode 112 is positioned on the buffer layer 111. The gate electrode 112 may be formed of any one selected from the group consisting of molybdenum (Mo), aluminum (Al), chromium (Cr), gold (Au), titanium (Ti), nickel (Ni), neodymium (Nd) and copper (Cu), or a combination thereof. The gate electrode 112 may have a multi-layered structure including any one selected from the group consisting of Mo, Al, Cr, Au, Ti, Ni, Nd and Cu, or a combination thereof. For example, the gate electrode 112 may have a double-layered structure including Mo/Al—Nd or Mo/Al.

A first insulating layer 113 is positioned on the gate electrode 112. The first insulating layer 113 may be formed of silicon oxide ($SiO_x$), silicon nitride ($SiN_x$), or a multi-layered structure or a combination thereof, but is not limited thereto.

An active layer 114 may be positioned on the first insulating layer 113. The active layer 114 may be formed of amorphous silicon or crystallized polycrystalline silicon. Although it is not shown, the active layer 114 may include a channel region, a source region, and a drain region. The source region and the drain region of the active layer 114 may be doped with p-type impurities or n-type impurities. The active layer 114 may include an ohmic contact layer for reducing a contact resistance.

A source electrode 115a and a drain electrode 115b are positioned on the active layer 114. Each of the source electrode 115a and the drain electrode 115b may have a single-layered structure or a multi-layered structure. When the source electrode 115a and the drain electrode 115b have the single-layered structure, the source electrode 115a and the drain electrode 115b may be formed of any one selected from the group consisting of Mo, Al, Cr, Au, Ti, Ni, Nd and Cu, or a combination thereof. When the source electrode 115a and the drain electrode 115b have the multi-layered structure, the source electrode 115a and the drain electrode 115b may have a double-layered structure including Mo/Al—Nd or a triple-layered structure including Mo/Al/Mo or Mo/Al—Nd/Mo.

A second insulating layer 116 is positioned on the source electrode 115a and the drain electrode 115b. The second insulating layer 116 may be formed of silicon oxide ($SiO_x$), silicon nitride ($SiN_x$), or a multi-layered structure or a combination thereof. Other materials may be used. The second insulating layer 116 may be a passivation layer.

A third insulating layer 117 is positioned on the second insulating layer 116. The third insulating layer 117 may be formed of silicon oxide ($SiO_x$), silicon nitride ($SiN_x$), or a multi-layered structure or a combination thereof. Other materials may be used. The third insulating layer 117 may be a planarization layer.

So far, the driving transistor T1 positioned on the substrate 110 was described. The organic light emitting diode D positioned on the driving transistor T1 will be described in detail below.

A first electrode 119 is positioned on the third insulating layer 117. The first electrode 119 may be selected as an anode electrode or a cathode electrode. When the first electrode 119 is selected as an anode electrode, the first electrode 119 may be formed of a transparent material such as indium-tin-oxide (ITO) and indium-zinc-oxide (IZO). Other materials may be used for the first electrode 119.

A bank layer 120 having an opening exposing a portion of the first electrode 119 is positioned on the first electrode 119. The bank layer 120 may be formed of an organic material such as benzocyclobutene (BCB)-based resin, acrylic resin, and polyimide resin. Other materials may be used.

An organic light emitting layer 121 is positioned inside the opening of the bank layer 120. The organic light emitting layer 121 includes a hole injection layer, a hole transport layer, a light emitting layer, an electron transport layer, and an electron injection layer.

A second electrode 122 is positioned on the organic light emitting layer 121. The second electrode 122 may be selected as an anode electrode or a cathode electrode. When the second electrode 122 is selected as a cathode electrode, the second electrode 122 may be formed of aluminum (Al) or neodymium (AlNd). Other materials may be used for the second electrode 122.

The OLED display according to the first exemplary embodiment of the invention is described below, and more specifically a structure of the organic light emitting diode is described below.

Figure 6:
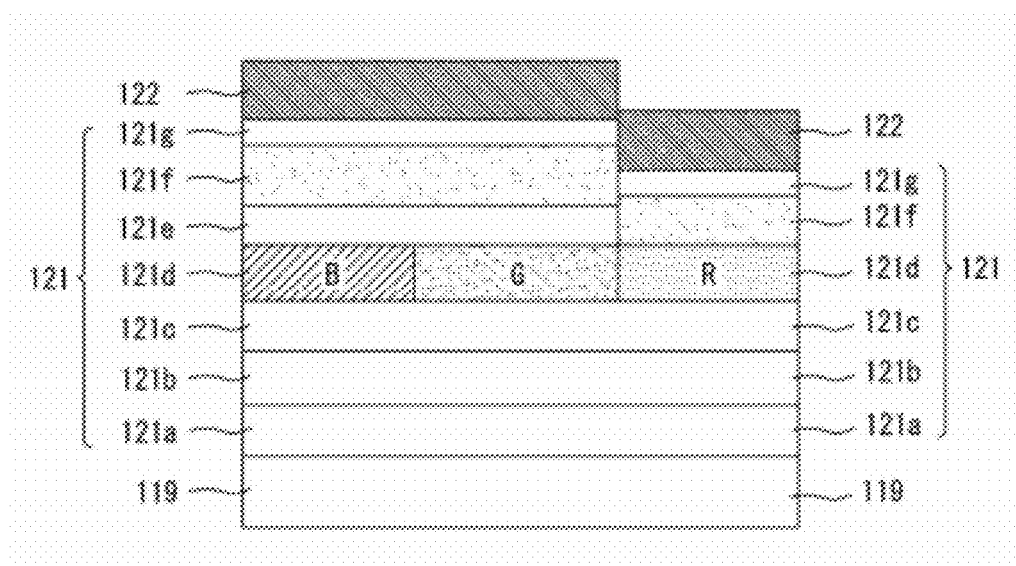
FIG. 6 illustrates a configuration of subpixels according to the first exemplary embodiment of the invention.

As shown in FIG. 6, the subpixels according to the first exemplary embodiment of the invention emit light of at least three colors and include red (R), green (G), and blue (B) subpixels each including the first electrode 119, the organic light emitting layer 121, and the second electrode 122. The first electrode 119 may be formed using indium-tin-oxide (ITO) or indium-zinc-oxide (IZO), and the second electrode 122 may be formed using aluminum (Al) or neodymium (AlNd). Other materials may be used for the first and second electrodes 119 and 122. The OLED display according to the first exemplary embodiment of the invention including the subpixels each having the above-described structure is a bottom emission type OLED display which emits light in a direction of the first electrode 119.

In the R, G, and B subpixels, the organic light emitting layer 121 of each of the G and B subpixels includes at least two electron transport layers 121e and 121f, and the organic light emitting layer 121 of the R subpixel includes at least one electron transport layer 121f. Thicknesses of the electron transport layers 121e and 121f of the G subpixel are substantially equal to thicknesses of the electron transport layers 121e and 121f of the B subpixel, respectively. A thickness of the electron transport layer 121f of the R subpixel is different from the thicknesses of the electron transport layers 121e and 121f of each of the G and B subpixels. In other words, the structures of the electron transport layers 121e and 121f of the G subpixel are substantially the same as the structures of the electron transport layers 121e and 121f of the B subpixel, respectively, but the structure of the electron transport layer 121f of the R subpixel is different from the structures of the electron transport layers 121e and 121f of each of the G and B subpixels.

The organic light emitting layer 121 of each of the G and B subpixels includes a hole injection layer 121a, a first hole transport layer 121b, a second hole transport layer 121c, a light emitting layer 121d, a first electron transport layer 121e, a second electron transport layer 121f, and an electron injection layer 121g on the first electrode 119 in the order named. On the other hand, the organic light emitting layer 121 of the R subpixel includes a hole injection layer 121a, a first hole transport layer 121b, a second hole transport layer 121c, a light emitting layer 121d, a second electron transport layer 121f, and an electron injection layer 121g on the first electrode 119 in the order named. In the R, G, and B subpixels, the second electron transport layer 121f of the organic light emitting layer 121 of the R subpixel and the second electron transport layer 121f of the organic light emitting layer 121 of each of the G and B subpixels are formed using the same material.

In the R, G, and B subpixels, the hole injection layer 121a may function to smoothly perform the injection of holes. The hole injection layer 121a may be formed of at least one selected from the group consisting of copper phthalocyanine (CuPc), PEDOT(poly(3,4)-ethylenedioxythiophene), polyaniline (PANI) and NPD(N,N-dinaphthyl-N,N'-diphenyl benzidine). Other materials may be used.

The first and second hole transport layers 121b and 121c may function to smoothly perform the transport of holes. The first and second hole transport layers 121b and 121c may be formed of at least one selected from the group consisting of NPD(N,N-dinaphthyl-N,N'-diphenyl benzidine), TPD(N,N'-bis-(3-methylphenyl)-N,N'-bis-(phenyl)-benzidine, s-TAD and MTDATA(4,4',4'''-Tris(N-3-methylphenyl-N-phenyl-amino)-triphenylamine). Other materials may be used. The first and second hole transport layers 121b and 121c may be formed using the same material or different materials.

The light emitting layer 121d may be formed using a material capable of producing red, green, and blue light, for example, a phosphorescence material or a fluorescence material. In the R, G, and B subpixels, the light emitting layer 121d of the R subpixel includes a host material including carbazole biphenyl (CBP) or N,N-dicarbazolyl-3,5-benzene (mCP). Further, the light emitting layer 121d of the R subpixel may be formed of a phosphorescence material including a dopant containing at least one selected from the group consisting of PIQIr(acac)(bis(1-phenylisoquinoline)acetylacetonate iridium), PQIr(acac)(bis(1-phenylquinoline)acetylacetonate iridium), PQIr(tris(1-phenylquinoline)iridium) and PtOEP (octaethylporphyrin platinum) or a fluorescence material containing PBD:Eu(DBM)3(Phen) or Perylene. Other materials may be used. The light emitting layer 121d of the G subpixel includes a host material containing CBP or mCP. Further, the light emitting layer 121d of the G subpixel may be formed of a phosphorescence material including a dopant containing Ir(ppy)3(fac tris(2-phenylpyridine)iridium) or a fluorescence material containing Alq3(tris(8-hydroxyquinolino)aluminum). Other materials may be used. The light emitting layer 121d of the B subpixel includes a host material containing CBP or mCP. Further, the light emitting layer 121d of the B subpixel may be formed of a phosphorescence material including a dopant containing (4,6-F2 ppy)2Irpic or a fluorescence material containing any one selected from the group consisting of spiro-DPVBi, spiro-6P, distyryl-benzene (DSB), distyryl-arylene (DSA), PFO-based polymer, PPV-based polymer and a combination thereof. Other materials may be used.

The first and second electron transport layers 121e and 121f may function to smoothly perform the transport of electrons. The first and second electron transport layers 121e and 121f may be formed of at least one selected from the group consisting of Alq3(tris(8-hydroxyquinolino)aluminum, PBD, TAZ, spiro-PBD, BAlq, and SAlq. Other materials may be used. The first and second electron transport layers 121e and 121f may be formed using the same material or different materials.

The electron injection layer 121g may functions to smoothly perform the injection of electrons. The electron injection layer 121g may be formed of Alq3(tris(8-hydroxyquinolino)aluminum), PBD, TAZ, Spiro-PBD, BAlq, SAlq, or LiF. Other materials may be used.

In the R, G, and B subpixels each having the above-described structure, a sum of the thicknesses of the electron transport layers 121e and 121f of the organic light emitting layer 121 is approximately 50 Å to 600 Å. Hence, white balance and color sense of the R, G, and B subpixels may be improved, and lifetimes of the R, G, and B subpixels may increase. More preferably, the sum of the thicknesses of the electron transport layers 121e and 121f of the organic light emitting layer 121 of each of the R, G, and B subpixels is approximately 150 Å to 400 Å. In the organic light emitting layer 121 of the R subpixel, a process for forming the first electron transport layer 121e is omitted in a process for forming the organic light emitting layer 121, and thus only one electron transport layer, i.e., the second electron transport layer 121f is formed in the process for forming the organic light emitting layer 121.

In the first exemplary embodiment, the thickness of each of the first and second electron transport layers 121e and 121f of each of the G and B subpixels is set to 50 Å to 300 Å, and the thickness of the second electron transport layer 121f of the R subpixel is set to 50 Å to 300 Å, so that the white balance, the color sense, and the lifetimes of the R, G, and B subpixels can be improved.

Figure 7:
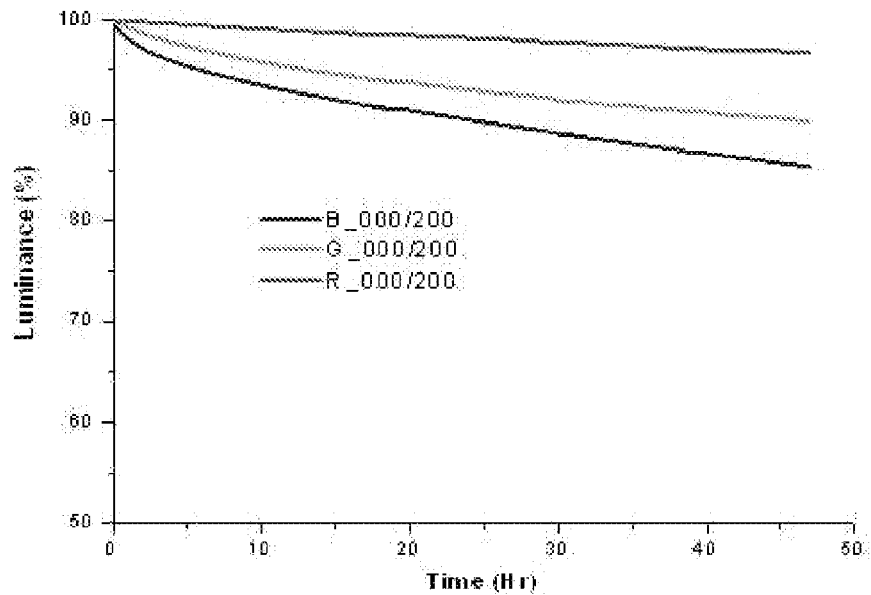
FIGS. 7 to 9 are graphs illustrating a luminance and lifetime of each of comparative examples and an embodiment of the invention.
Figure 8:
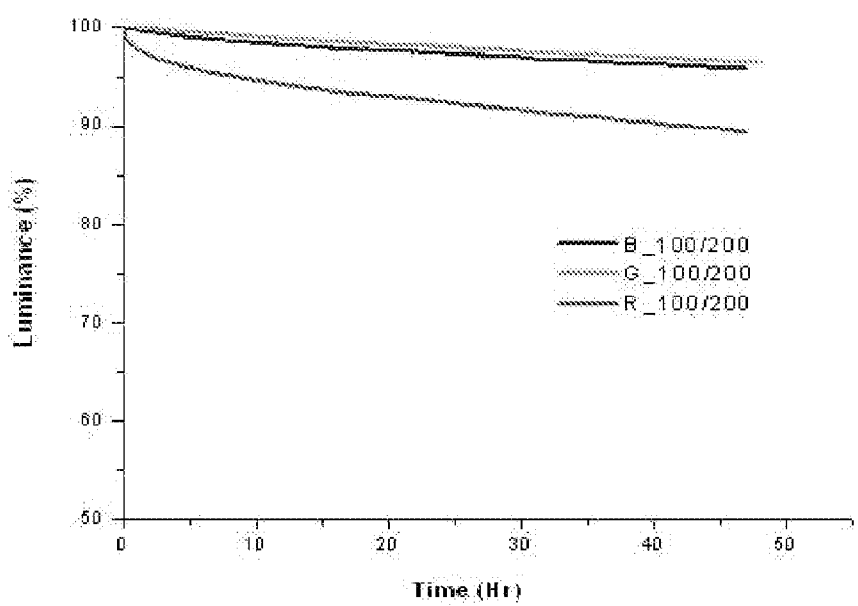
Figure 9:
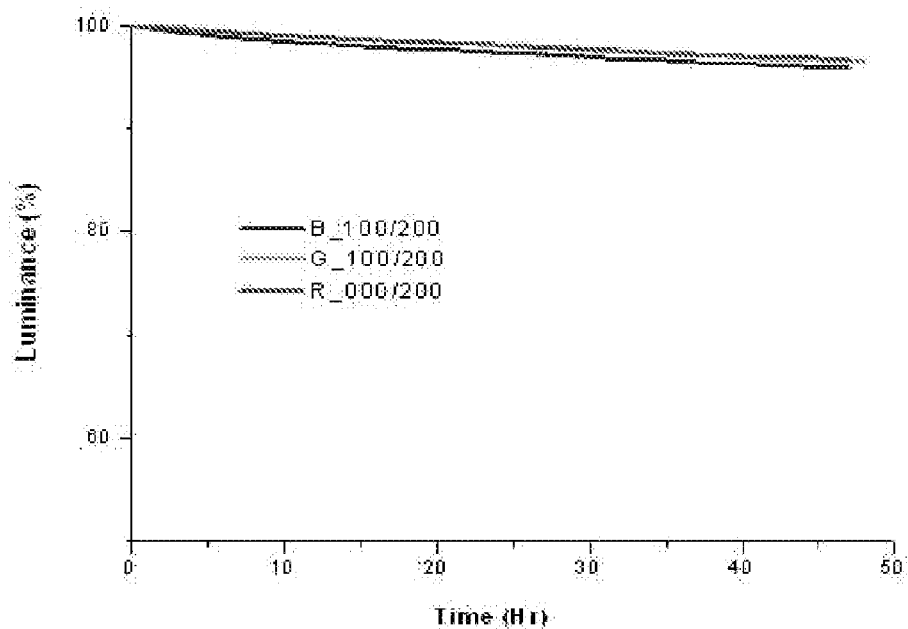

Comparative examples and an experimental example according to the first exemplary embodiment showing optical characteristic and lifetime depending on the thickness and the structure of the electron transport layer are described below with reference to Tables 1 to 3 and FIGS. 7 to 9. The following Tables 1 to 3 are shows voltages V, light intensities cd/A, currents lm/W, quantum efficiency η and color coordinates x, y.

A comparative example 1 is described in the following Table 1 and FIG. 7.

TABLE 1

| ETL 0/200 Å | | V | cd/A | lm/W | η (QE) | x | y |
|---|---|---|---|---|---|---|---|
| B | ETL (200 Å) | 3.6 | 7.9 | 6.8 | 8.6 | 0.150 | 0.118 |
| G | ETL (200 Å) | 2.9 | 31.4 | 34.5 | 10.2 | 0.231 | 0.675 |
| R | ETL (200 Å) | 3.2 | 17.8 | 17.6 | 19.4 | 0.668 | 0.329 |

A comparative example 2 is described in the following Table 2 and FIG. 8.

TABLE 2

| ETL 100/200 Å | | V | cd/A | lm/W | η (QE) | x | y |
|---|---|---|---|---|---|---|---|
| B | ETL (300 Å) | 3.8 | 10.1 | 8.2 | 11.0 | 0.147 | 0.116 |
| G | ETL (300 Å) | 2.9 | 39.9 | 42.8 | 12.5 | 0.240 | 0.682 |
| R | ETL (300 Å) | 3.3 | 18.5 | 17.9 | 20.7 | 0.670 | 0.327 |

The experimental example according to the first exemplary embodiment is described in the following Table 3 and FIG. 9.

TABLE 3

| ETL Conditions | | V | cd/A | lm/W | η (QE) | x | y |
|---|---|---|---|---|---|---|---|
| B | ETL (300 Å) | 3.8 | 10.1 | 8.2 | 11.0 | 0.147 | 0.116 |
| G | ETL (300 Å) | 2.9 | 39.9 | 42.8 | 12.5 | 0.240 | 0.682 |
| R | ETL (200 Å) | 3.2 | 17.8 | 17.6 | 19.4 | 0.668 | 0.329 |

In the comparative examples 1 and 2, an element having the same structure as the first exemplary embodiment was manufactured except a thickness of an electron transport layer (ETL). A thickness of an electron transport layer (ETL) of an organic light emitting layer of each of R, G, and B subpixels was set to 200 Å in the comparative example 1, and a thickness of an electron transport layer (ETL) of an organic light emitting layer of each of R, G, and B subpixels was set to 300 Å in the comparative example 2. In the comparative example 1, a deposition process was performed once to form the electron transport layer of each of R, G, and B subpixels. In the comparative example 2, an electron transport material was deposited once to form a first electron transport layer having a thickness of 100 Å, and then the electron transport material was deposited again to form a second electron transport layer having a thickness of 200 Å. Hence, the electron transport layers of the R, G, and B subpixels each having the thickness of 300 Å were formed.

On the other hand, in the experimental example according to the first exemplary embodiment, a thickness of an electron transport layer (ETL) of an organic light emitting layer of each of B and G subpixels was set to 300 Å, and a thickness of an electron transport layer (ETL) of an organic light emitting layer of an R subpixel was set to 200 Å. In each of the B and G subpixels, an electron transport material was deposited once to form a first electron transport layer having a thickness of 100 Å, and then the electron transport material was deposited again to form a second electron transport layer having a thickness of 200 Å. More specifically, as described in the first exemplary embodiment, the first and second electron transport layers 121e and 121f of each of the B and G subpixels were formed. In the R subpixel, the first deposition process for forming the first electron transport layer 121e was omitted, and then the second deposition process for forming the second electron transport layer 121f was performed to form the second electron transport layer 121f of the R subpixel under the same conditions as the second electron transport layer 121f of each of the B and G subpixels.

A light emission amount (i.e., quantum efficiency QE) in the optical characteristics and a required luminance of the white balance in the lifetime in the experimental example according to the first exemplary embodiment were improved further than the comparative examples 1 and 2 because of the thickness and the structural difference of the electron transport layer ETL. Although the first exemplary embodiment of the invention described only the structure indicated in Tables 1 to 3, a required luminance of the white balance and a light emission amount of the R, G, and B subpixels can be improved by varying the thickness or the deposition structure of the electron transport layer of each of the R, G, and B subpixels.

In the first exemplary embodiment, thicknesses of the hole transport layers 121b and 121c of the organic light emitting layer 121 of at least one of the R, G, and B subpixels are different from each other. Hence, a change width of CIE color coordinates x and y in the optical characteristic may greatly increase. However, because the lifetime increases through changes in the thickness of the electron transport layer, a change width of a color sense may decrease. Therefore, the changes in the thicknesses of the electron transport layer greatly contribute to the lifetime increase and the performance improvement, compared with the changes in the thickness of the hole transport layer.

Figure 10:
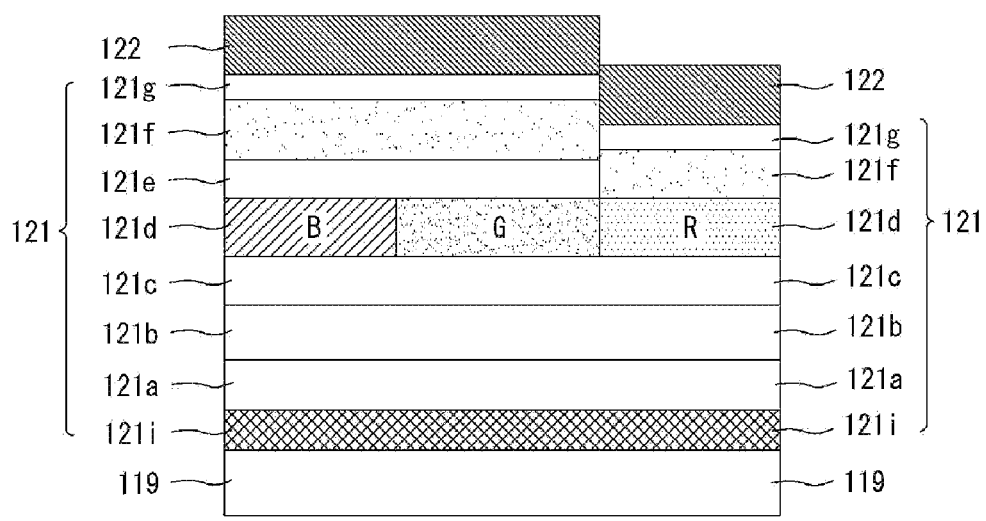
FIG. 10 illustrates a modification of the first exemplary embodiment of the invention.

FIG. 10 illustrates an OLED display according to a modified embodiment of the first exemplary embodiment. Since configuration of the modified embodiment is substantially the same as the first exemplary embodiment except that an organic light emitting layer 121 of each of R, G, and B subpixels further includes an organic/inorganic buffer layer 121i, a further description may be briefly made or may be entirely omitted. As shown in FIG. 10, the organic/inorganic buffer layer 121i is formed between a first electrode 119 and a hole injection layer 121a. The organic/inorganic buffer layer 121i contacts an interface between the first electrodes 119 of the R, G, and B subpixels and an interface between hole injection layers 121a of the R, G, and B subpixels to stabilize the interfaces and a withstanding voltage. Hence, lifetime and performance of the OLED display according to the modified embodiment are improved. The organic/inorganic buffer layer 121i may be formed through a co-deposition method using an inorganic material (for example, MgF2) and an organic material. Other methods may be used for the organic/inorganic buffer layer 121i.

Second Exemplary Embodiment

Figure 11:
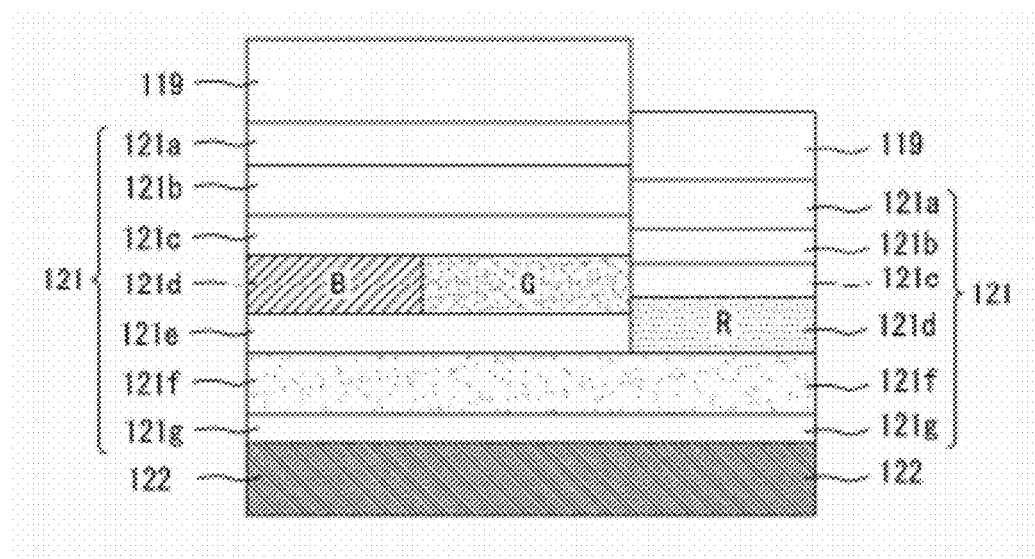
FIG. 11 illustrates a configuration of subpixels according to a second exemplary embodiment of the invention.

As shown in FIG. 11, subpixels according to a second exemplary embodiment of the invention emit light of at least three colors and include red (R), green (G), and blue (B) subpixels each including a second electrode 122, an organic light emitting layer 121, and a first electrode 119. The first electrode 119 may be formed using indium-tin-oxide (ITO) or indium-zinc-oxide (IZO), and the second electrode 122 may be formed using aluminum (Al) or neodymium (AlNd). Other materials may be used for the first and second electrodes 119 and 122. An OLED display according to the second exemplary embodiment of the invention including the subpixels each having the above-described structure is a top emission type OLED display which emits light in a direction of the second electrode 122.

In the R, G, and B subpixels, the organic light emitting layer 121 of each of the G and B subpixels includes at least two electron transport layers 121e and 121f, and the organic light emitting layer 121 of the R subpixel includes at least one electron transport layer 121f. Thicknesses of the electron transport layers 121e and 121f of the G subpixel are substantially equal to thicknesses of the electron transport layers 121e and 121f of the B subpixel, respectively. A thickness of the electron transport layer 121f of the R subpixel is different from the thicknesses of the electron transport layers 121e and 121f of each of the G and B subpixels. In other words, the structures of the electron transport layers 121e and 121f of the G subpixel are substantially the same as the structures of the electron transport layers 121e and 121f of the B subpixel, respectively, but the structure of the electron transport layer 121f of the R subpixel is different from the structures of the electron transport layers 121e and 121f of each of the G and B subpixels.

The organic light emitting layer 121 of each of the G and B subpixels includes an electron injection layer 121g, a second electron transport layer 121f, a first electron transport layer 121e, a light emitting layer 121d, a second hole transport layer 121c, a first hole transport layer 121b, and a hole injection layer 121a on the second electrode 122 in the order named. On the other hand, the organic light emitting layer 121 of the R subpixel includes an electron injection layer 121g, a second electron transport layer 121f, a light emitting layer 121d, a second hole transport layer 121c, a first hole transport layer 121b, and a hole injection layer 121a on the second electrode 122 in the order named. In the R, G, and B subpixels, the second electron transport layer 121f of the organic light emitting layer 121 of the R subpixel and the second electron transport layer 121f of the organic light emitting layer 121 of each of the G and B subpixels are formed using the same material.

Since materials and structures of the hole injection layer 121a, the first and second hole transport layers 121b and 121c, the light emitting layer 121d, the first and second electron transport layer 121e and 121f, and the electron injection layer 121g in the second exemplary embodiment of the invention are substantially the same as the first exemplary embodiment of the invention, a further description may be briefly made or may be entirely omitted.

In the R, G, and B subpixels each having the above-described structure, a sum of the thicknesses of the electron transport layers 121e and 121f of the organic light emitting layer 121 is approximately 50 Å to 600 Å in the same manner as the first exemplary embodiment. Hence, white balance and color sense of the R, G, and B subpixels may be improved, and lifetimes of the R, G, and B subpixels may increase. More preferably, the sum of the thicknesses of the electron transport layers 121e and 121f of the organic light emitting layer 121 of each of the R, G, and B subpixels is approximately 150 Å to 400 Å in the same manner as the first exemplary embodiment. In the organic light emitting layer 121 of the R subpixel, a process for forming the first electron transport layer 121e is omitted in a process for forming the organic light emitting layer 121, and thus only one electron transport layer, i.e., the second electron transport layer 121f is formed in the process for forming the organic light emitting layer 121.

In the second exemplary embodiment, the thickness of each of the first and second electron transport layers 121e and 121f of each of the G and B subpixels is set to 50 Å to 300 Å and the thickness of the second electron transport layer 121f of the R subpixel is set to 50 Å to 300 Å, so that the white balance, the color sense, and the lifetimes of the R, G, and B subpixels can be improved.

In the second exemplary embodiment in the same manner as Tables 1 to 3 and FIGS. 7 to 10 of the first exemplary embodiment, a light emission amount (i.e., quantum efficiency QE) in the optical characteristics and a required luminance of the white balance in the lifetime are improved further than the comparative examples 1 and 2 because of the thicknesses and the structural differences of the electron transport layers 121e and 121f of each of the R, G, and B subpixels. Although the second exemplary embodiment described only the structure indicated in Tables 1 to 3, a required luminance of the white balance and a light emission amount of the R, G, and B subpixels can be improved by varying the thickness or the deposition structure of the electron transport layer of each of the R, G, and B subpixels.

In the second exemplary embodiment in the same manner as the first exemplary embodiment, thicknesses of the hole transport layers 121b and 121c of the organic light emitting layer 121 of at least one of the R, G, and B subpixels are different from each other. Hence, a change width of CIE color coordinates x and y in the optical characteristic may greatly increase. However, because the lifetime increases through changes in the thickness of the electron transport layer, a change width of a color sense may decrease. Therefore, the changes in the thicknesses of the electron transport layer greatly contribute to the lifetime increase and the performance improvement, compared with the changes in the thickness of the hole transport layer.

Figure 12:
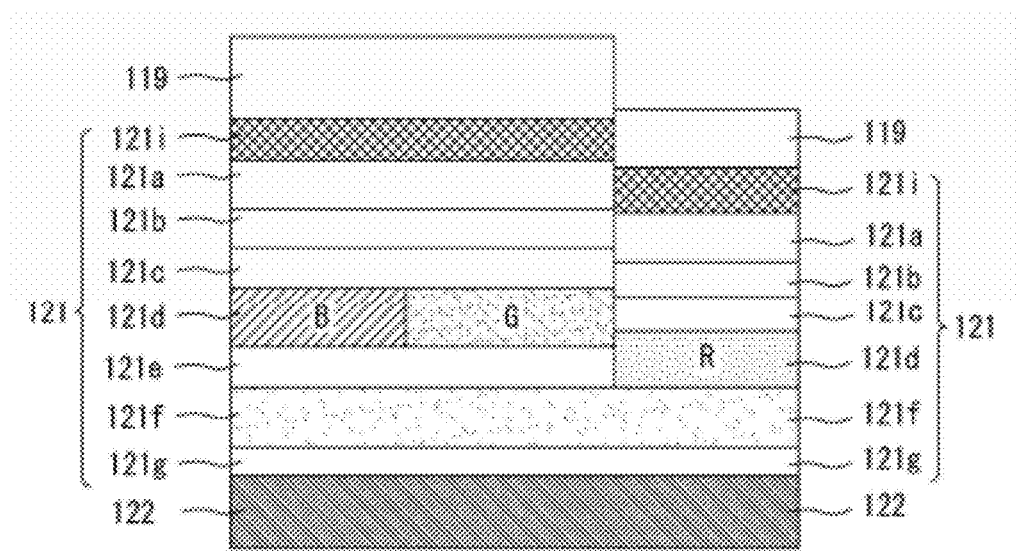
FIG. 12 illustrates a modification of the second exemplary embodiment of the invention.

FIG. 12 illustrates an OLED display according to a modified embodiment of the second exemplary embodiment of the invention. Since configuration of the modified embodiment is substantially the same as the second exemplary embodiment except that an organic light emitting layer 121 of each of R, G, and B subpixels further includes an organic/inorganic buffer layer 121i, a further description may be briefly made or may be entirely omitted. As shown in FIG. 12, the organic/inorganic buffer layer 121i is formed between a first electrode 119 and a hole injection layer 121a. The organic/inorganic buffer layer 121i contacts an interface between the first electrodes 119 of the R, G, and B subpixels and an interface between hole injection layers 121a of the R, G, and B subpixels to stabilize the interfaces and a withstanding voltage. Hence, lifetime and performance of the OLED display according to the modified embodiment are improved. The organic/inorganic buffer layer 121i may be formed through a co-deposition method using an inorganic material (for example, $MgF_2$) and an organic material. Other methods may be used for the organic/inorganic buffer layer 121i.

As described above, in the top or bottom emission type OLED display according to the embodiments of the invention, a color coordinate movement or image sticking are prevented by standardizing lifetimes of the R, G, and B subpixels in a required luminance condition of white balance. Hence, a uniform luminance of the OLED display can be obtained and the optical characteristics of the OLED display can be improved.

Furthermore, in the top or bottom emission type OLED display according to the embodiments of the invention, power consumption can be reduced by improving the efficiency of the G and B subpixels, and also an initial lifetime of the OLED display capable of preventing the image sticking can increase.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An organic light emitting diode display comprising:
a plurality of subpixels that emit light of at least three colors, the plurality of subpixels each including a first electrode, an organic light emitting layer, and a second electrode,
wherein each of the organic light emitting layers of at least two of the plurality of subpixels includes at least two electron transport layers,
wherein the organic light emitting layer of at least one of the plurality of subpixels includes at least one electron transport layer,
wherein the at least two of the plurality of subpixels includes a first electron transport layer and a second electron transport layer formed on the first electron transport layer,
wherein the at least one of the plurality of subpixels is an red subpixel, a structure of an electron transport layer of the red subpixel being different from the structures of the electron transport layers of the blue and green subpixels,
wherein the blue subpixel and the green subpixels includes the first electron transport layer and the second electron transport layer reflectively and the red subpixel only includes the second electron transport layer without the first electron transport layer,
wherein a total thickness of each of the electron transport layers of the organic light emitting layers of the plurality of subpixels is approximately 150 Å to 400 Å,
wherein a thickness of each of the first and second electron transport layers is approximately 50 Å to 300 Å, and
wherein the thickness of the first electron transport layers is differ from the thickness of the second electron transport layer.

2. The organic light emitting diode display of claim 1, wherein the first electron transport layer and the second electron transport layer which are formed using the same material.

3. The organic light emitting diode display of claim 1, wherein the first electron transport layer and the second electron transport layer which are formed using different materials.

4. The organic light emitting diode display of claim 1, wherein each of the organic light emitting layers of the plurality of subpixels includes a hole injection layer and a hole transport layer,
wherein the hole injection layer and the hole transport layer of the organic light emitting layer in the at least one of the plurality of subpixels have different thicknesses.

5. The organic light emitting diode display of claim 1, wherein each of the organic light emitting layers of the plurality of subpixels includes an organic/inorganic buffer layer contacting the first electrode.

6. The organic light emitting diode display of claim 1, wherein the thickness of the second electron transport layers is thicker than the thickness of the first electron transport layer.

* * * * *